(12) United States Patent
Mittal et al.

(10) Patent No.: US 10,991,445 B2
(45) Date of Patent: Apr. 27, 2021

(54) MEMORY SUB-SYSTEM INCLUDING AN IN-PACKAGE SEQUENCER TO PERFORM ERROR CORRECTION AND MEMORY TESTING OPERATIONS

(71) Applicant: Micron Technology, Inc., Boise, ID (US)

(72) Inventors: Samir Mittal, Palo Alto, CA (US); Ying Yu Tai, Mountain View, CA (US); Cheng Yuan Wu, Fremont, CA (US); Jiangli Zhu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 145 days.

(21) Appl. No.: 16/123,911

(22) Filed: Sep. 6, 2018

(65) Prior Publication Data

US 2020/0082901 A1 Mar. 12, 2020

(51) Int. Cl.
| | |
|---|---|
| *G11C 29/44* | (2006.01) |
| *G11C 29/48* | (2006.01) |
| *G11C 29/56* | (2006.01) |
| *G06F 11/10* | (2006.01) |
| *G11C 29/14* | (2006.01) |
| *G11C 29/52* | (2006.01) |

(52) U.S. Cl.
CPC .......... *G11C 29/48* (2013.01); *G06F 11/1068* (2013.01); *G11C 29/14* (2013.01); *G11C 29/44* (2013.01); *G11C 29/52* (2013.01); *G11C 29/56008* (2013.01)

(58) Field of Classification Search
CPC ... G11C 29/48; G11C 29/56008; G11C 29/14; G11C 29/44; G11C 29/52; G11C 29/42; G11C 29/06; G11C 2029/5002; G11C 29/1201; G11C 2029/3602; G11C 29/36; G11C 29/50012; G11C 2029/5004; G06F 11/1068; G06F 11/1048
USPC .......................................................... 714/718
See application file for complete search history.

(56) References Cited

U.S. PATENT DOCUMENTS

| | | | |
|---|---|---|---|
| 5,430,094 A | 7/1995 | Gola et al. | |
| 5,612,834 A * | 3/1997 | Strang, Jr. ............. | G06F 3/0601 360/135 |
| 6,707,718 B1 * | 3/2004 | Halim .................... | G11C 29/16 365/185.18 |

(Continued)

FOREIGN PATENT DOCUMENTS

| | | |
|---|---|---|
| KR | 20110010770 A | 2/2011 |
| KR | 20110069049 A | 6/2011 |

OTHER PUBLICATIONS

PCT International Search Report and Written Opinion for International Application No. PCT/US2019/050057, dated Jan. 7, 2020, 9 pages.

*Primary Examiner* — Albert Decady
*Assistant Examiner* — Enam Ahmed
(74) *Attorney, Agent, or Firm* — Lowenstein Sandler LLP

(57) ABSTRACT

A processing device of a sequencer component can receive data from a controller that is external to the sequencer component. The processing device of the sequencer component can perform an error correction operation on the data received from the controller that is external to the sequencer component to generate a code word associated with the data. The code word can be stored at a memory component coupled with the sequencer component.

18 Claims, 5 Drawing Sheets

(56) References Cited

U.S. PATENT DOCUMENTS

| | | | | |
|---|---|---|---|---|
| 6,754,025 B1* | 6/2004 | Shepherd | ............ | G11B 25/043 |
| | | | | 360/51 |
| 8,069,379 B2* | 11/2011 | Perego | ................ | G11C 7/1075 |
| | | | | 714/718 |
| 2003/0167427 A1* | 9/2003 | Kraus | .................... | G11C 29/48 |
| | | | | 714/718 |
| 2009/0207543 A1* | 8/2009 | Boniface | ................ | H02H 3/16 |
| | | | | 361/86 |
| 2011/0041039 A1* | 2/2011 | Harari | ................ | G06F 11/1068 |
| | | | | 714/773 |
| 2013/0159813 A1* | 6/2013 | Radke | ................ | G06F 11/1068 |
| | | | | 714/763 |
| 2014/0192583 A1* | 7/2014 | Rajan | ...................... | G11C 5/06 |
| | | | | 365/63 |
| 2015/0187436 A1* | 7/2015 | Querbach | ............. | G11C 29/38 |
| | | | | 714/720 |
| 2016/0103732 A1 | 4/2016 | Tuers et al. | | |
| 2018/0246783 A1 | 8/2018 | Avraham et al. | | |

\* cited by examiner

MEMORY SUB-SYSTEM INCLUDING AN IN-PACKAGE SEQUENCER TO PERFORM ERROR CORRECTION AND MEMORY TESTING OPERATIONS

TECHNICAL FIELD

Embodiments of the disclosure relate generally to memory sub-systems, and more specifically, relate to a memory sub-system including an in-package sequencer to perform error correction and memory testing operations.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
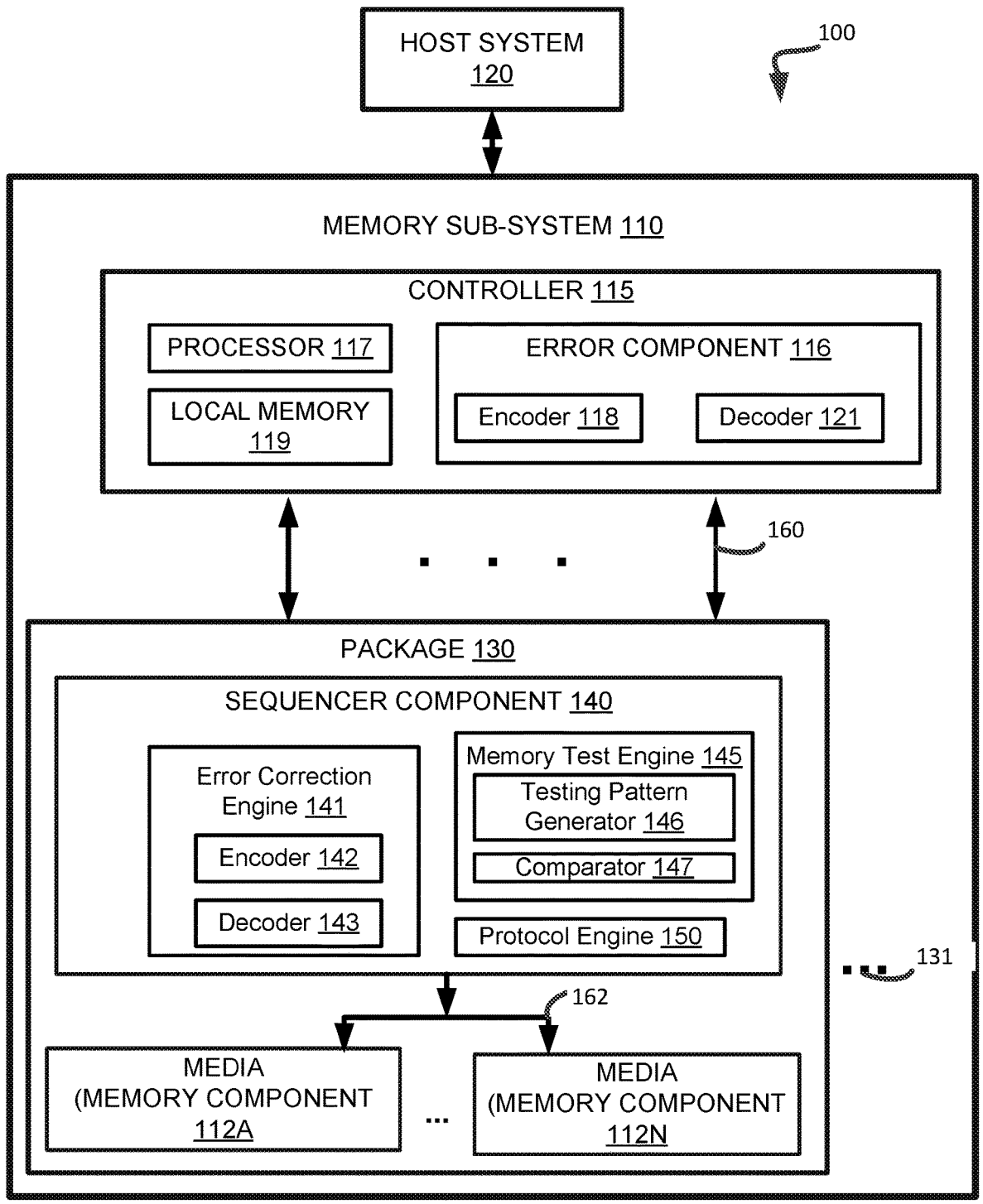
FIG. 1 illustrates an example computing environment that includes a memory sub-system in accordance with some embodiments of the present disclosure.

Aspects of the present disclosure are directed to a memory sub-system including an in package sequencer component to perform error correction and memory testing operations. A memory sub-system is also hereinafter referred to as a "memory device". An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system. Each memory component can include a different type of media. Examples of media include, but are not limited to, a cross-point array of non-volatile memory and flash based memory such as single-level cell (SLC) memory, triple-level cell (TLC) memory, and quad-level cell (QLC) memory. The characteristics of different types of media can be different from one media type to another media type. One example of a characteristic associated with a memory component is data density. Data density corresponds to an amount of data (e.g., bits of data) that can be stored per memory cell of a memory component. Another example of a characteristic of a memory component is access speed, which corresponds to an amount of time for the memory component to access data stored at the memory component.

A memory sub-system can also include a controller operatively coupled to the memory components. The controller can operate as a "bridge" between a host system and memory components of the memory sub-system for data transmission and/or management. In some instances, the controller and the associated memory components can be manufactured by different vendors and each of the controller and/or memory components can have a respective package. To increase the capacity of the memory sub-system, memory components can be added to the memory sub-system and the controller can interface with the multiple memory components. In conventional systems, a controller can include a large number of pins to interface with the memory components when a parallel interface is used between the controller and the memory components. Including a large number of pins can increase package size of the controller, which can in turn increase the form factor of the conventional system.

In some conventional systems, the controller interfaces with the host system using a Serializer/Deserializer (SerDes) connection (e.g., Serial Advanced Technology Attachment (SATA), Universal Serial Bus (USB), Peripheral Component Interconnect Express (PCIe), Universal Flash Storage (UFS), etc.) to minimize pin count. Conventional controllers can include a sequencer component that uses a protocol and timing requirements (e.g., read/write latency, etc.) specific to the memory type of the memory components to interface with and instruct the memory components. The controller can interface with memory components via a parallel interface utilizing Double Data Rate (DDR) to obtain a certain bandwidth and capacity. Increasing the number of memory components that interface directly with a controller can use more space and cause difficulty when routing the parallel interfaces. As a result, the routing paths (e.g., traces) between the controller and the memory components can be long, thereby compromising signal integrity. Further, using longer routing paths to the memory components via the parallel interface can cause loads to be larger, thereby consuming undesirable amounts of power.

Additionally, to improve the reliability of data stored in a memory sub-system, some conventional controllers can perform error correction operations. An error correction operation can refer to any suitable technique for correcting one or more errors in data, such as error correction codes, redundancy operations, etc.

The error correction operations use parameters specific to the memory type of the memory components coupled to a conventional controller. The parameters can be used to configure a size of the code word based on type of the memory component, for example. When a new generation of memory component is added to the memory sub-system to expand the capacity of the memory sub-system, the firmware of the controller is typically updated with new parameters of the memory type of the new generation memory component. The controller can be shutdown to be updated, thereby causing processing downtime. When the controller is being updated, the memory system can experience throughput issues because the controller is not performing the error correction operations. Also, the controller can read and reread data from a memory component that stores a code word when attempting to decode the code word. The data can be sent across the parallel interface between the controller and the memory component, which can use an undesirable amount of power and/or affect data integrity due to the length of the trace.

Further, conventionally, when memory components are tested, the memory components can be coupled to a testing board that performs one or more tests on the memory components. Each memory type of the memory components can have different testing requirements. Thus, there can be different testing boards that are dedicated to testing particular types of memory components. The cost of testing the memory components using dedicated testing boards can be undesirably high. Further, for some newer memory components, there may not be a testing board developed to test the newer memory components.

Aspects of the present disclosure address the above and other deficiencies by separating the sequencer component from the controller and including the sequencer component with one or more memory components in an individual package. The sequencer component can perform error correction operations and/or memory testing operations. The sequencer component can be manufactured in an independent silicon, the memory components can be manufactured in independent die, and the independent silicon and the independent die can be included in the same package. A package can refer to a case that supports electrical contacts which connect the package to an application board and that prevents physical damage and corrosion. The application board can refer to a printed circuit board on which the controller, the package, and/or the memory components reside. Each sequencer component operates with a certain type (e.g., cross-point array, NAND flash, etc.) of memory component and can operate with multiple memory components having that type of memory. The sequencer component can interface with the memory components via a protocol specific to the memory type. Each package can include multiple sequencer components interfacing with respective differing types of memory components. Further, the memory sub-system can include multiple packages each including one or more sequencer components interfacing with one or more memory components.

The sequencer component can interface with the controller via a SerDes connection that provides higher bandwidth than a parallel interface. Further, SerDes connections use less pins than parallel connections. Thus, the pin count in the controller can be reduced using the disclosed techniques, while still accommodating the same number or more memory components included in the packages coupled to the controller. Reducing the pin count of the controller can result in a reduced form factor for the memory sub-system that includes the same capacity (e.g., same number of memory components) as previous conventional systems that included more pins.

Further, signal integrity can be improved because the distance between the sequencer component and the memory components within an independent package is shorter than the distance between the sequencer component and the memory components in conventional systems where the sequencer component is within the controller. That is, the package is smaller than an application board, and thus, the trace between the sequencer component and the memory components within the package is shorter than conventional systems where the trace runs on the application board. The shorter traces can improve the signal integrity, as well as reduce the load on the package and consume less power than conventional systems where the routing paths are longer.

In some embodiments, the sequencer component can perform error correction operations. For example, the sequencer component can include a processing device that executes an error correction engine. The error correction engine can include an encoder and a decoder that perform an encoding error correction operation and a decoding error correction operation, respectively. The error correction engine can be programmed to perform the error correction operations based on the memory type of the memory components to which the sequencer component is attached. Performing at least some of the error correction operations at the sequencer component can reduce complexity at the controller because the controller does not have to manage all of the different error correction code parameters associated with the different memory types of memory components in the memory sub-system. Further, the consumption of power can be decreased and data signal integrity can be improved by reducing the traffic of data over the connection between the controller and the sequencer component because the sequencer component can perform the error correction operations locally in the package and send the decoded data to the controller. That is, in some embodiments, the sequencer component performing at least some of error correction operations can reduce the traffic of data sent across the connection between the controller and the sequencer component.

In some embodiments, the sequencer component can iteratively perform error correction operations until errors are corrected in data read from the one or more memory components. For example, a first error correction operation can be performed to correct at least one error in the data, and another error correction operation can be performed on the modified data to correct another error. Such an embodiment can enhance performance of the memory sub-system because the multiple data transmissions between the memory components and the sequencer components during error correction are faster using the shorter traces in the package, as opposed to using the longer traces between the memory components and the controller in conventional memory systems. Also, in some embodiments, the sequencer component can perform a first level of one or more error correction operations that corrects one or more errors included in data read from the one or more memory components, and the controller can perform a second level of one or more error correction operations to correct additional (e.g., remaining) errors included in the data. Such an embodiment can also enhance performance by correcting a majority of errors at the sequencer component, thereby reducing the number of back and forth transmissions between the controller and the memory components in conventional memory systems.

In some embodiments, the sequencer component can transmit a notification to the controller that indicates that the sequencer component includes error correction functionality. This notification can cause the controller to send raw data received from the host to the sequencer component without performing an encoding error correction operation on the raw data. In such an instance, the sequencer component can receive the raw data and encode the raw data to generate a code word based on the memory type of the memory components in the package. Also, if the sequencer component indicates that the sequencer component does not have error correction functionality or does not provide the notification indicating that the sequencer component includes error correction functionality, the controller can perform the error correction operations for any data associated with the memory components coupled to that sequencer component. In another example, the controller can query the sequencer component to determine whether the sequencer has error correction functionality. If not, the controller can perform the error correction operations for any data associated with the memory components coupled to that sequencer component.

Additionally, in some embodiments, the sequencer component can also include a memory test engine to perform one or more tests on the memory components coupled to the sequencer component. Including the memory test engine and performing memory tests within the sequencer component can reduce the cost associated with testing the memory components. Further, the memory test engine can be updated to perform tests specific to the type of memory components that are coupled to the sequencer component, thereby enabling testing new memory component types that lack testing boards. The memory test engine can include a testing pattern generator and a comparator. The testing pattern generator can generate a testing pattern that corresponds to operations to read and/or write data to the one or more memory components. The testing pattern generator can generate the data to be written to the one or more memory components. The testing pattern can simulate certain operational conditions, such as performing numerous writes to determine whether the memory component can function properly at certain temperatures. Further, the testing pattern can stress test timing requirements for transmitting signals from the sequencer component to the memory component over the interface between the sequencer component and the memory component. The test can be performed utilizing different voltages to determine whether the memory component writes and/or reads data properly under different voltages. Further, the memory test engine can program memory parameters, such as read voltage levels to increase the quality of reading data during the tests.

The testing pattern can be based on the memory type of the one or more memory components. For example, there can be known interfacing issues on different memory types so the testing pattern can include certain read and/or write patterns to screen out defects in the particular memory types. The testing pattern generator can be programmable by a test engineer. In some embodiments, the testing pattern can be already stored in a memory accessible to the memory test engine and/or can be received from another component and/or device.

After the testing pattern is performed to read and/or write data, the comparator can be used to determine whether data read from the one or more memory components is what is expected for a particular test by comparing the data retrieved from the one or more memory components to the data written to the one or more memory components. If the test is successful, the retrieved and written data should match and a notification can be transmitted indicating the same. If the test is unsuccessful, the retrieved and written data should not match and a notification can be transmitted indicating the same.

Some advantages of the present disclosure include enhancing performance of the memory sub-system by performing error correction operations at the sequencer and reducing the number of transmissions between the memory controller and the memory components. Further, power consumption can be reduced by performing error correction operations at the sequencer because the data read by the sequencer during the error correction operation is transmitted between the sequencer and the memory component over a short trace. This can improve the signal integrity by using the short trace between the sequencer and the memory component to perform the error correction operations, which can improve the quality of correcting any errors if there are not errors introduced in the data during transmission. Additional advantages can include reducing cost of testing the memory components by including the memory test engine in the sequencer.

FIG. 1 illustrates an example computing environment 100 that includes a memory sub-system 110 in accordance with some embodiments of the present disclosure. The memory sub-system 110 can include media, such as memory components 112. The memory components 112 can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system.

In some embodiments, the memory components 112 can be included in a package 130. There may be numerous packages (represented by ellipsis 131) that each include one or more respective memory components. As depicted, the memory components 112A to 112N are coupled to a sequencer component 140 in the package 130A. It should be understood that there can be numerous sequencer components included in the package 130, and each sequencer component can be coupled to one or more respective memory components. Each of the sequencer components 140 can be manufactured in independent silicon and each of the memory components 112 can be manufactured in independent die. The memory sub-system 110 can include a memory system controller 115 (hereinafter referred to as "controller"). The sequencer component 140 and memory components 112 can be included in a single package 130 and coupled via short traces 162 to improve performance of issuing commands from the sequencer component 140 to the memory components 112. Power load consumption can be reduced and data signal integrity can be increased by using shorter traces between the sequencer component 140 and the memory components as opposed to conventional arrangements. Also, as discussed herein, moving the sequencer component 140 to a package 130 separate from the controller 115 can provide numerous other benefits, such as reducing the form factor of the memory sub-system 110, increasing bandwidth between the controller 115 and the memory components 112, and so forth.

For example, the sequencer component 140 and memory components 112 in the packages 130 can be coupled to the controller 115 via a SerDes interface 160, as opposed to a parallel interface. A SerDes interface 160 provides higher bandwidth than a parallel interface, and also uses less outgoing pins, thereby reducing the number of pins needed for the controller 115 to provide a memory sub-system 110 with the same capacity (e.g., number of memory components 112). For instance, a SerDes interface can use six pins (e.g., two for clock, two for transmit, two for receive), whereas a parallel interface can use more than twenty pins to operate. Reducing the outgoing pin count of the controller 115 can improve the form factor of the entire memory sub-system 110 by reducing the size of the controller 110. Further, removing the sequencer component 140 from the controller 115 can also reduce the size of the controller 115.

The sequencer component 140 can perform one or more operations and can be configured based on the type of memory component 112 to which a respective sequencer component is coupled. For example, the sequencer component 140 can include an error correction engine 141, a memory test engine 145, and a protocol engine 150. The error correction engine 141 can perform one or more error correction operations to encode data received from the controller 115 and/or decode data read from the memory components 112A. Accordingly, the error correction engine 141 can include an encoder 142 and a decoder 143. The decoding error correction operations can use any suitable error correction technique, such as error correction codes, redundancy operations (e.g., XOR), etc. Error correction codes can be used to improve the reliability of data stored in the memory sub-system 110. An error correction code can refer to a technique for expressing a sequence of data to enable errors introduced to the data to be detected and corrected based on the other remaining data. The sequence of data can be referred to as code words. Types of error correction codes can include block codes (e.g., Hamming codes, Reed Solomon codes, etc.). The redundancy operation can refer to using a logical operation (e.g., XOR) to reconstruct the data. The redundancy reconstruction operation uses information of the exact error locations and the number of known error locations does not exceed a threshold.

Using the shorter traces in the package 130 can improve the performance of the error correction process, thereby enhancing overall performance of the memory sub-system. Further, in some embodiments, the controller does not need to manage the various error correction parameters for the memory type of the memory components 112 because the respective sequencer component of each package can manage the parameters for their respective memory components 112 instead.

In addition, the sequencer component 140 can include a memory test engine 145 to perform one or more tests on the memory components 112. The tests can be tailored to ensure the memory components 112 are compatible with the controller 115. The memory test engine 145 includes a testing pattern generator 146 and a comparator 147. The testing pattern generator 146 can generate a testing pattern to test the memory components 112. The testing pattern can correspond to operations (e.g., read and/or write) associated with generated data to be performed on the memory components 112. The tests can stress test the memory components 112 by using a testing pattern to test the operation of the memory components 112 under various temperatures. Additionally, the testing pattern can test a timing window of when data signals associated with the memory components 112 are sent and/or received. The test can ensure that the memory components 112 satisfy timing requirements of transmitting signals via an interface between the memory components 112 and the sequencer component 140. The testing pattern generator 146 can cause different voltages to be applied throughout the test to determine whether the memory components 112 function properly (e.g., store correct data) when different voltages are applied. Also, since differing memory types (e.g., cross-point array, flash, etc.) can be associated with differing read voltage levels, the testing pattern generator 146 can program memory parameters such as the read voltage level to enhance the quality of data read from the particular memory type of the memory components 112.

After the test completes, the comparator 147 can compare data read from the memory components 112 with the data associated with the testing pattern that was written to the memory components 112 during the test. If the data is as expected (e.g., the read data matches the data written), then the comparator 147 can determine that the test completed successfully and can provide a notification indicating the same. If the data is not as expected (e.g., the read data does not match the data written), then the comparator 147 can determine that the test did not complete successfully and can provide a notification indicating the same.

The sequencer component 140 can also perform other operations using a protocol engine 150. For example, the protocol engine 150 can attempt to maximize interface bandwidth between the memory components 112 and the sequencer component 140 by enforcing the timing requirements for the memory type of the memory components 112. Timing requirements can relate to latency of read/write operations performed for the memory type. The protocol engine 150 can time when to issue the read/write commands based on the latencies for the types of the memory components 112. Further, the protocol engine 150 can reorder commands based on certain rules related to the commands and addresses involved in the commands. That is, the protocol engine 150 can reorder read/write requests by considering rules that ensure data coherency. For example, if there is a write request and then a read request to the same address, a rule can dictate that the read request cannot be moved prior to the write request because the read request would return old data. Thus, the protocol engine 150 can reorder operations and enforce the timing of when to transmit the operations to the memory components 112 based on the bandwidth of the memory components 112.

In general, the computing environment 100 can include a host system 120 that uses the memory sub-system 110. For example, the host system 120 can write data to the memory sub-system 110 and read data from the memory sub-system 110. The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a Serial/Deserial (SerDes) interface, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112 can include any combination of the different types of non-volatile memory components and/or volatile memory components. An example of non-volatile memory components includes a negative-and (NAND) type flash memory. Each of the memory components 112 can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112 can be based on any other type of memory such as a volatile memory. In some embodiments, the memory components 112 can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112 can be grouped as memory pages or data blocks that can refer to a unit of the memory component used to store data.

The controller 115 can communicate with the memory components 112 via the sequencer component 140 to perform operations such as reading data, writing data, or erasing data at the memory components 112 and other such operations. In one example, the controller 115 can include an error component 116 with an encoder 118 and a decoder 121. In some embodiments, the error component 116 can be used to perform any suitable encoding and/or decoding error correction operations using the encoder 118 and the decoder 121, respectively, for packages including sequencers that lack error correction functionality. In some embodiments, the error component 116 can be used as a second level of error correction to provide additional error correction functionality for data that is partially corrected by a first level of error correction performed by the error correction engine 141 of the sequencer component 140. In some embodiments, the error component 116 can encode a portion of data received from the host system 120 and transmit the partially encoded data to the sequencer component 140 to enable the data to be completed encoded by the error correction engine 141. In some embodiments, the controller 115 can receive a notification that the sequencer component 140 includes error correction functionality. In such an instance, the controller 115 can forward raw data received from the host system 120 to the sequencer component 140. Raw data can refer to data that has not had an error correction operation (e.g., encoding) applied.

If used, the error component 116 can perform an encoding error correction operation that encodes raw data received by the host system 120 with additional data bits (e.g., parity bits) to form a code word to be written to the memory components 112 via the sequencer component 140. The error component 116 can also perform a decoding error correction operation that decodes the code word by removing the additional data bits. The encoding/decoding operations can use certain configuration parameters that are based on the type of the memory components 112 on which the data is to be stored. The controller 115 can send one or more code words to the sequencer component 140. The sequencer component 140 can determine which portions of which code words to store on the memory components 112A to 112N by considering the bandwidth and availability of the memory components 112A to 112N, timing requirements (e.g., read/write latency) of the memory components 112A to 112N, and rules regarding sequencing of read/write operations.

The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112. In some embodiments, the controller 115 can also perform address translations between a logical block address and a physical block address that are associated with the memory components 112. The controller 115 can also perform memory management operations such as determining a wear leveling scheme tailored for the memory type of the memory components and issuing operations representing the wear leveling scheme to the sequencer component 140.

The controller 115 can be responsible for other operations, such as garbage collection operations, encryption operations, and/or caching operations. The controller 115 can further include host interface circuitry to communicate with the host system 120 via the physical host interface. The host interface circuitry can convert the commands received from the host system into command instructions to access the memory components 112 via the sequencer component 140, as well as convert responses associated with the memory components 112 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112.

Figure 2:
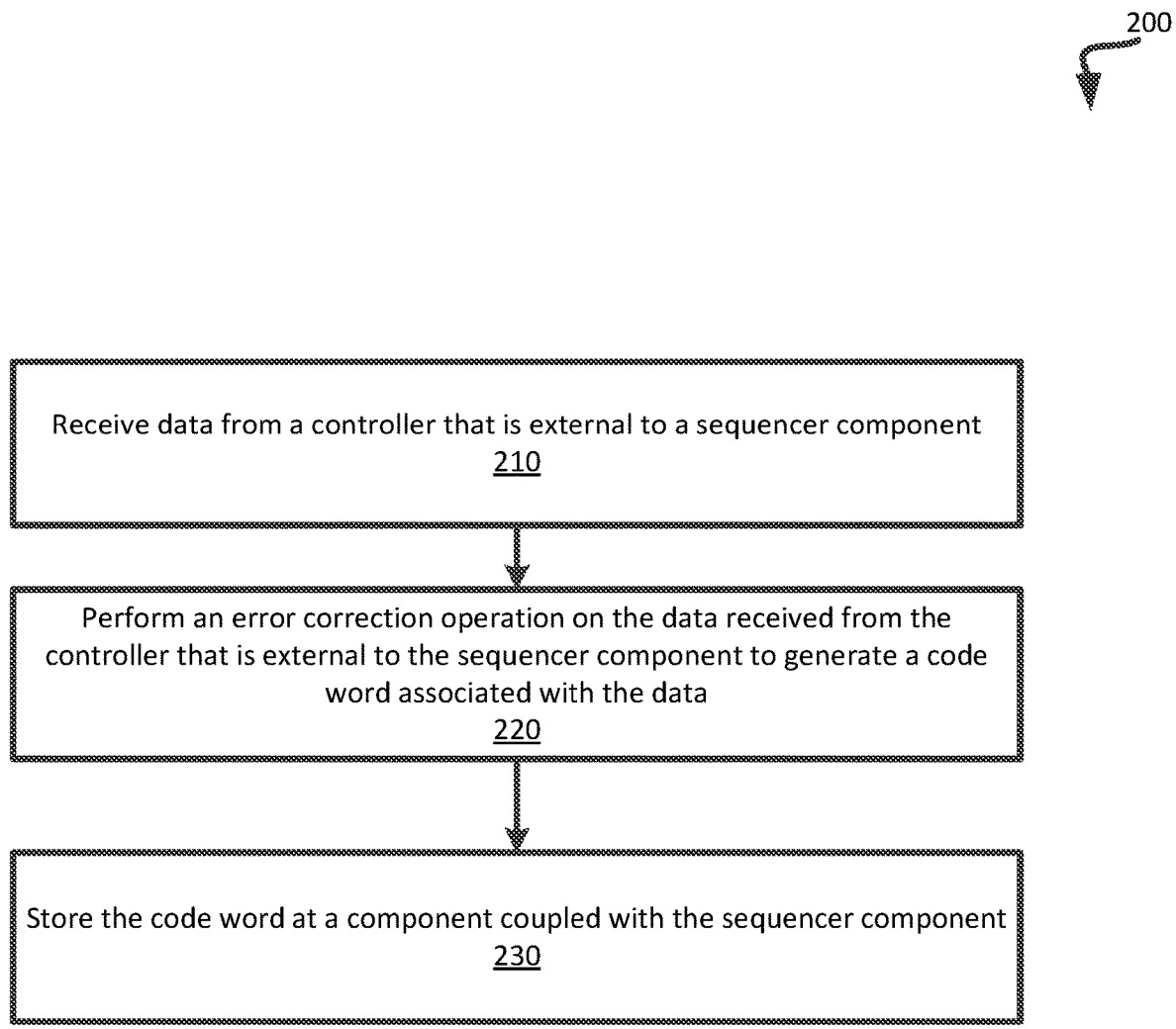
FIG. 2 is a flow diagram of an example method for performing an encoding error correction operation on data in accordance with some embodiments of the present disclosure.

FIG. 2 is a flow diagram of an example method 200 for performing an encoding error correction operation on data in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by a processing device of the sequencer component 140 (e.g., the error correction engine 141) of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 210, the processing device of the sequencer component 140 receives data from the controller 115 that is external to the sequencer component 140. The sequencer component 140 is included in the package 130 that includes the memory component 112A, and the controller 115 is external to the package 130. The data received from the controller 115 can be sent to the controller 115 by the host system 120 as raw data (e.g., data from the host system 120 that is not encoded) and the host system 120 can specify that the data is to be written to the memory components 112. In some embodiments, prior to receiving the data, the processing device of the sequencer component 140 can transmit a notification to the controller 115 that indicates that the sequencer component 140 includes functionality to perform error correction operations. The notification can cause the controller 115 to transmit raw data to the sequencer component 140 that is external to the memory controller 115 without performing an encoding operation on the raw data at the controller 115. In some embodiments, where the controller 115 and the sequencer 140 coordinate to perform error correction operations, the controller 115 can partially encode the data and the processing device of the sequencer component 140 can fully encode the partially encoded data received from the controller 115.

At block 220, the processing device of the sequencer component 140 performs an error correction operation on the data received from the controller 115. The error correction operation may be an encoding error correction operation that encodes raw data or partially encoded data received from the controller 115 with additional data bits (e.g., parity bits) to generate a code word. The processing device can receive an indication of a memory type of the memory component 112A. The memory type can correspond to a structure (e.g., cross-point, flash, etc.) of the memory component 112A. The encoding error correction operation can use certain configuration parameters that are based on the memory type of the memory component 112A at which the code word is to be stored. For example, a size of the code word, a rate of the code word, and/or a type of the code word can be selected based on the memory type of the memory component 112A.

In some embodiments, a maximum distance separable code, such as a Reed Solomon code, can be used for the encoding error correction operation. A Reed Solomon code encodes a block of data by adding extra redundant bits to the data. For example, k data symbols of s bits each can be encoded into an n symbol code word with parity symbols added to the k data symbols. A mathematical operation (e.g., polynomial) can be generated based on the block of data and the parity bits can be obtained using the mathematical operation. The parity bits can be added to the block of data.

Various reasons (e.g., noisy communication, memory component failure, asynchronous power loss, etc.) can cause the data of the code word to include errors (e.g., flipped bits, lost bits, etc.). If there are errors in the code word stored at the memory component 112A or memory components 112A-112N, the parity bits or other bits of the code word can be used in the original mathematical operation to obtain the original block of data and/or the parity bits and correct the errors in the code word.

At block 230, the processing device of the sequencer component 140 stores the code word at the memory component 112A coupled to the sequencer component 140. In some embodiments, there may be numerous memory components 112A-112N coupled to the sequencer component 140. The processing device can determine one or more of the memory components 112A-112N to store the code word at based on bandwidth of the memory components 112A-112N, available storage of the memory components 112A-112N, wear leveling, etc. For example, the processing device can stripe the code word across more than one memory component 112A-112N to distribute the code word, which may enable certain techniques such as redundant array of independent disks.

Figure 3:
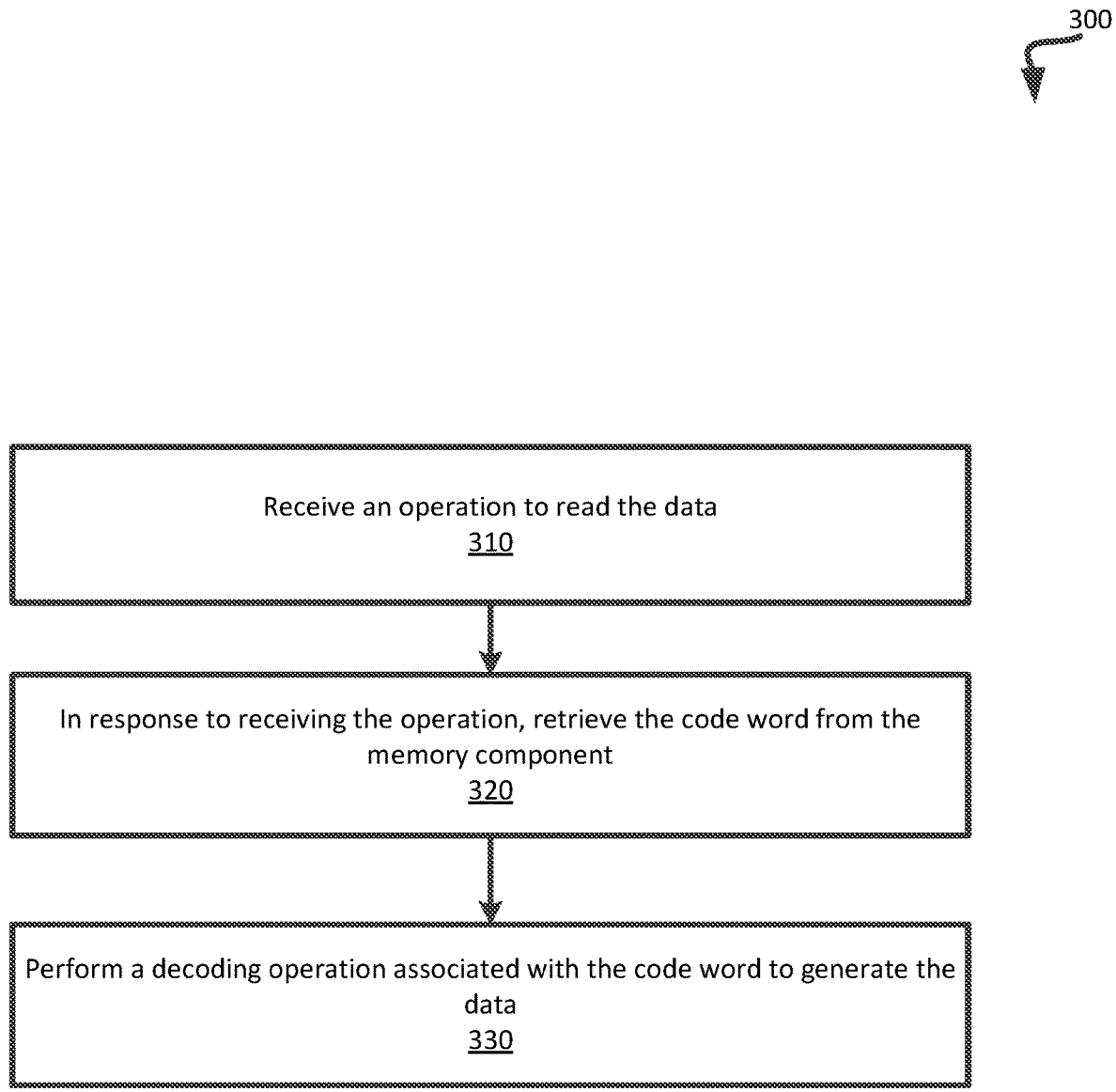
FIG. 3 is a flow diagram of an example method for performing a decoding error correction operation on data in accordance with some embodiments of the present disclosure.

FIG. 3 is a flow diagram of an example method 300 for performing a decoding error correction operation on data in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by a processing device of the sequencer component 140 (e.g., error correction engine 141) of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 310, the processing device of a sequencer component 140 receives an operation to read the data (e.g., code word) that is stored at the memory component 112A. The operation can be sent by the host system 120 to the controller 115, and the controller 115 can send the operation to the processing device of the sequencer component 140.

At block 320, the processing device of the sequencer component 140, in response to receiving the operation, retrieves the code word from the memory component 112A or memory components 112A-112N.

At block 330, the processing device of the sequencer component 140 performs a decoding operation associated with the code word to generate the data. In some embodiments, the decoding operation can include applying an error correction code to the code word to attempt to decode the code word (e.g., removing the parity bits) and/or fix one or more bit errors. For example, applying the error correction code to the data stored on the memory component 112A or the memory components 112A-112N can result in obtaining an updated data including at least one corrected bit. If a Reed Solomon code is used, a mathematical operation (e.g., polynomial) that was used to encode the code word can be used with one or more original bits and/or parity bits of the code word to obtain a correct bit to which to change the bit including the error.

In some embodiments, the processing device of the sequencer component 140 can identify that a portion of the data includes a first error that cannot be decoded by the decoding operation that is performed by the sequencer component 140. The decoding operation may have corrected one or more other errors, but the portion of data may still include at least one other error. Accordingly, the processing device can perform another error correction operation (e.g., error correction code, redundancy operation, etc.) on the data including the portion. Performing multiple reads of the data can enable the processing device to obtain information that indicates whether values of the data are trustable (e.g., returns the same value each read), experienced a flipping (e.g., moving the read voltage level shows the value changes), or are an error (e.g., wrong value). As previously discussed, due to the proximity of the sequencer component 140 to the memory component 112A in the package 130, the traces between the sequencer component 140 and the memory component 112A are short, thereby reducing power consumption and improving read latency during decoding. Thus, including a sequencer component 140 that performs error correction operations in a package 130 with a memory component 112A can improve the performance of a memory sub-system 110.

In some embodiments, when the processing device of the sequencer component 140 identifies that a portion of the data includes an error that cannot be decoded by the decoding operation that is performed by the sequencer component 140, the processing device can transmit the data to the controller 115 to cause the controller 115 to decode at least the portion of the data to correct the error that cannot be decoded by the decoding operation performed by the sequencer component 140. The data can include at least one corrected bit as a result of the decoding operation performed by the sequencer component 140. In this embodiment, the decoding operation performed by the sequencer component 140 can represent a first level of error correction and the decoding operation performed by the controller 115 can represent a second level of error correction. The error correction operations may or may not use any information related to the error bit location. In some embodiments, the first level of error correction performed by the sequencer component 140 can be stronger than the second level of error correction performed by the controller 115. That is, the first level of error correction can usually correct more errors than the second level of error correction. For example, the first level of error correction can correct a first number of bits (e.g., 20) out of a 128 byte code word, and the second level of error correction can correct a second number of bits (e.g., 1 symbol) fewer than the first number of bits. In any embodiment, when the code word is decoded and the original data is obtained, the original data can be transmitted to the host system 120.

Figure 4:
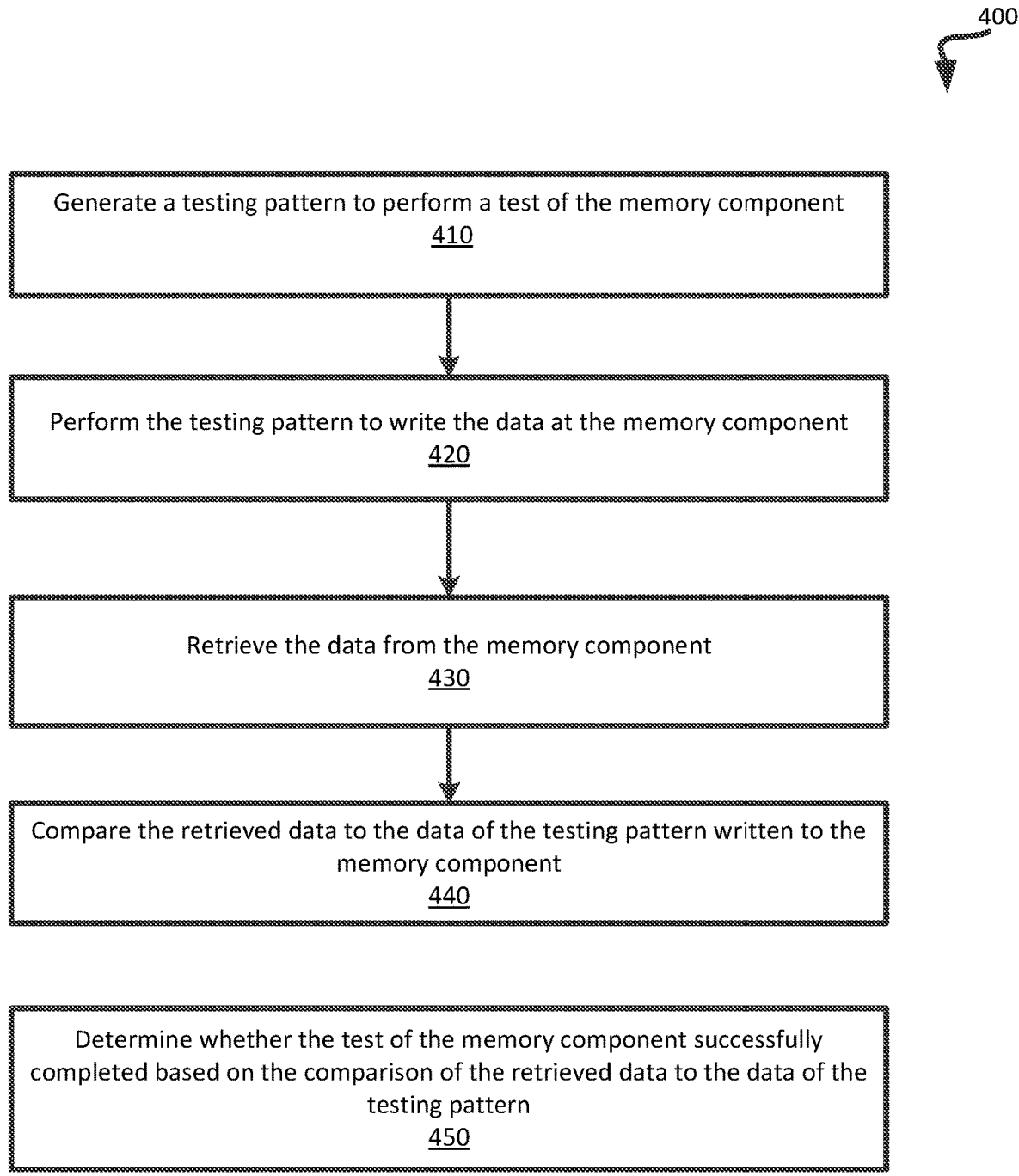
FIG. 4 is a flow diagram of an example method for performing a test of a memory component in accordance with some embodiments of the present disclosure.

FIG. 4 is a flow diagram of an example method 400 for performing a test of a memory component 112A in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by a processing device of the sequencer component 140 (e.g., memory test engine 145) of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 410, the processing device of the sequencer component 140 generates a testing pattern to perform a test of the memory component. The sequencer component 140 resides in a package 130 that is separate from the controller 115. The testing pattern can correspond to read, write, and/or erase operations on data at the memory component 112A. The processing device can generate the pattern of operations to perform, as well as the data that is to be written to and/or read from the memory component 112A. Certain memory types of memory components 112A can be associated with certain issues (e.g., bridging issues). The processing device can receive an indication of the memory type of the memory component 112A and tailor the testing pattern based on the memory type to test the known issues.

The testing pattern can be designed to test that the memory component 112A functions properly (e.g., stores the data correctly and provides the data correctly) at certain temperatures. The temperatures can be selected based on design specifications for the memory component 112A in view of the memory type of the memory components 112A. The testing pattern can use a specific amount or order of operations to be performed to cause the memory component 112A to reach the various temperatures during operation. Further, various different voltages can be used during the tests to evaluate whether the memory components functions properly when differing voltages are applied. Such temperature and/or voltage stress testing can provide an indication of the endurance of the memory component 112A.

In some embodiments, the testing pattern can stress test timing requirements (e.g., a timing window) associated with the memory component 112A via an interface between the sequencer component 140 and the memory component 112A. The timing requirements can specify an amount of time the memory component 112A has to transmit signals and/or perform operations. Testing the timing requirements can ensure that the memory component 112A meets certain responsivity standards associated with the memory type of the memory components 112A, and can ensure that the memory component 112A is compatible with the controller 115 with which the memory component 112A is to operate. In some embodiments, the testing pattern can be generated to stress test the timing requirements at the different temperatures and/or at the different voltages.

At block 420, the processing device of the sequencer component 140 performs the testing pattern to write the data at the memory component 112A. As discussed above, in some embodiments, the testing pattern can include any suitable pattern of operations (e.g., write, read, erase, etc.) and data that are determined to be useful in testing one or more aspects of the memory component 112A.

At block 430, the processing device of the sequencer component 140 retrieves the data from the memory component 112A. The processing device can retrieve the data by reading the data from the memory component 112A. In some instances, the data can include one or more errors (e.g., flipped bit, erased bit, etc.). The processing device of the sequencer component 140 executing the memory test engine 145 can program memory parameters, such as the read level voltages to attempt to re-read the data using the modified read level voltage. In some embodiments, using the different read level voltage can return the data without errors. If the data still contains one or more errors, the processing device can use the error correction engine 141 of the sequencer component 140 to attempt to correct the errors. The error correction engine 141 can perform one or more error correction operations to the data of the testing pattern written to the memory component 112A and return the corrected data to the memory test engine 145.

At block 440, the processing device of the sequencer component 140 compares the retrieved data to the data of the testing pattern written to the memory component 112A. The processing device of the sequencer component 140 executing the comparator 147 can compare the retrieved data to the data of the testing pattern written to the memory component 112A.

At block 450, the processing device of the sequencer component 140 determines whether the test of the memory component 112A successfully completed based on the comparison of the retrieved data to the data of the testing pattern. For example, if the retrieved data matches the data written of the testing pattern written to the memory component 112A, the processing device can determine that the test successfully completed (e.g., the memory component 112A functioned as expected). Responsive to determining that the test of the memory component 112A successfully completed, the processing device can transmit a notification indicating that the test successfully completed. If the retrieved data does not match the data of the testing pattern written to the memory component 112A, the processing device can determine that the test did not successfully complete. Responsive to determining that the test of the memory component 112A did not successfully complete, the processing device can transmit a notification indicating that the test did not successfully completed.

Embedding the memory test engine 145 within the sequencer component 140 in an individual package 130 that includes the memory components 112A-112N can reduce the complexity and cost associated with testing the memory components 112A-112N. For example, separate boards that are specific to the memory types of the memory components may not be needed because the memory test engine 145 generates the testing pattern specifically for the memory type of the memory components 112A-112N coupled to the sequencer component 140. Thus, the package 130 can be connected to a memory-type agnostic board to test the memory components using the memory test engine 145 of the sequencer component 140. Numerous different packages 130 including differing memory types of memory components can use the same memory-type agnostic board to run their respective tests.

Figure 5:
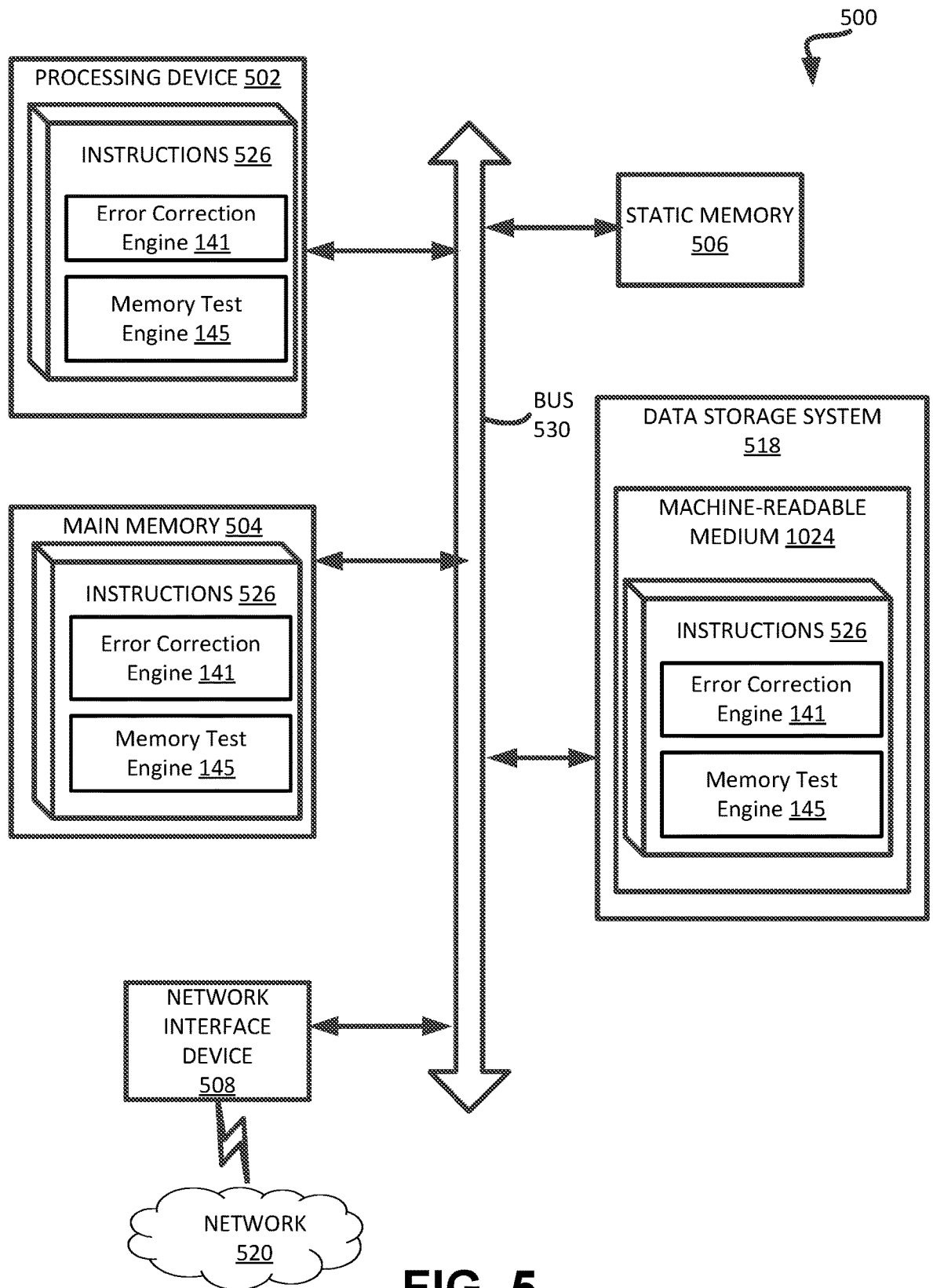
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller or to perform the operations of a sequencer component 140 (e.g., to perform operations corresponding to the error correction engine 141 and/or the memory test engine 145 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 602 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to an error correction engine 141 and/or a memory test engine 145 of the sequencer component 140 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
transmitting, by a sequencer component, a notification to a controller that indicates that the sequencer component includes functionality to perform an error correction operation to cause the controller to transmit data comprising raw data to the sequencer component that is external to the controller without performing an encoding operation on the raw data at the controller;
receiving, by a processing device of the sequencer component, the data from the controller that is external to the sequencer component, wherein the sequencer component resides in a package that is separate from the controller;
performing, by the processing device of the sequencer component, the error correction operation on the data received from the controller that is external to the sequencer component to generate a code word associated with the data; and
storing the code word at a memory component coupled with the sequencer component.

2. The method of claim 1, further comprising:
receiving an indication of a memory type of the memory component, the memory type corresponding to a structure of the memory component, wherein performing the error correction operation to generate the code word is based on the memory type of the memory component.

3. The method of claim 1, further comprising:
receiving an operation to read the data;
in response to receiving the operation, retrieving the code word from the memory component; and
performing, by the processing device of the sequencer component, a decoding operation associated with the code word to generate the data.

4. The method of claim 3, further comprising:
identifying that a portion of the data includes a first error that cannot be decoded by the decoding operation that is performed by the sequencer component, wherein decoding the data corrected at least a second error in the data; and
performing, by the processing device of the sequencer component, a second error correction operation to decode the portion of the data to correct the first error.

5. The method of claim 3, further comprising:
identifying that a portion of the data includes a first error that cannot be decoded by the decoding operation that is performed by the sequencer component, wherein the decoding operation corrects at least a second error in the data; and
transmitting the data to the controller to cause the controller to decode at least the portion of the data to correct the first error that cannot be decoded by the decoding operation performed by the sequencer component.

6. The method of claim 1, wherein the sequencer component is included in the package that includes the memory component.

7. A system comprising:
a memory component; and
a processing device of a sequencer component, operatively coupled with the memory component, to:
transmit a notification to a controller that indicates that the sequencer component includes functionality to perform an error correction operation to cause the controller to transmit data comprising raw data to the sequencer component that is external to the controller without performing an encoding operation on the raw data at the controller;
receive the data from the controller that is external to the sequencer component wherein the sequencer component resides in a package that is separate from the controller;
perform the error correction operation on the data received from the controller that is external to the sequencer component to generate a code word associated with the data; and
store the code word at the memory component operatively coupled with the processing device of the sequencer component.

8. The system of claim 7, wherein the sequencer component is included in the package that includes the memory component.

9. The system of claim 7, wherein the processing device of the sequencer component is further to:
receive an indication of a memory type of the memory component, the memory type corresponding to a structure of the memory component, wherein performing the error correction operation to generate the code word is based on the memory type of the memory component.

10. The system of claim 7, wherein the processing device of the sequencer component is further to:
receive an operation to read the data;
in response to receiving the operation, retrieve the code word from the memory component; and
perform a decoding operation associated with the code word to generate the data.

11. The system of claim 10, wherein the processing device of the sequencer component is further to:
identify that a portion of the data includes a first error that cannot be decoded by the decoding operation that is performed by the sequencer component, wherein decoding the data corrected at least a second error in the data; and
perform a second error correction operation to decode the portion of the data to correct the first error.

12. The system of claim 10, wherein the processing device of the sequencer component is further to:
identify that a portion of the data includes a first error that cannot be decoded by the decoding operation that is performed by the sequencer component, wherein the decoding operation corrects at least a second error in the data; and
transmit the data to the controller to cause the controller to decode at least the portion of the data to correct the first error that cannot be decoded by the decoding operation performed by the sequencer component.

13. A method comprising:
generating, by a processing device of a sequencer component, a testing pattern to perform a test of a memory component, wherein the testing pattern corresponds to a plurality of operations to write data at the memory component, wherein the sequencer component resides in a package that is separate from a controller, the sequencer component configured to transmit a notification to the controller that indicates that the sequencer component includes functionality to perform an error correction operation to cause the controller to transmit data comprising raw data to the sequencer component that is external to the controller without performing an encoding operation on the raw data at the controller;
performing the testing pattern to write the data at the memory component;
retrieving the data from the memory component;
comparing the retrieved data to the data of the testing pattern written to the memory component; and
determining whether the test of the memory component successfully completed based on the comparison of the retrieved data to the data of the testing pattern.

14. The method of claim 13, wherein performing the testing pattern causes the memory component to operate at a plurality of different temperatures.

15. The method of claim 13, wherein the testing pattern is performed using a plurality of different voltages.

16. The method of claim 13, wherein the testing pattern stress tests timing requirements for transmitting, via an interface between the sequencer component and the memory component, signals from the sequencer component to the memory component.

17. The method of claim 13, wherein the processing device is further to modify a read voltage level to be applied when reading the data from the memory component.

18. The method of claim 13, wherein the processing device is further to:
responsive to determining that the test of the memory component successfully completed, transmit a notification indicating that the test successfully completed; or
responsive to determining that the test of the memory component did not successfully complete, transmit a notification indicating that the test did not successfully complete.

* * * * *